United States Patent [19]
Lin et al.

[11] Patent Number: 5,646,894
[45] Date of Patent: Jul. 8, 1997

[54] SMART BOOST CIRCUIT FOR LOW VOLTAGE FLASH EPROM

[75] Inventors: Sung-Wei Lin, Houston; Tim M. Coffman; Ronald J. Syzdek, both of Sugar Land, all of Tex.

[73] Assignee: Texas Instruments Incorporated

[21] Appl. No.: 560,771

[22] Filed: Nov. 21, 1995

[51] Int. Cl.$^6$ .................................................. G11C 11/40
[52] U.S. Cl. ........................ 365/189.09; 365/189.07
[58] Field of Search .................... 365/189.09, 189.07, 365/185.23, 226; 327/536, 538

[56] References Cited

U.S. PATENT DOCUMENTS 5,075,572  12/1991  Poteet ........................ 327/536
5,446,697  8/1995  Yoo ........................... 365/226

Primary Examiner—A. Zarabian
Attorney, Agent, or Firm—Theodore D. Lindgren; Leo N. Heiting; Richard L. Donaldson

[57] ABSTRACT

The circuit of this invention improves significantly the programming speed of a Flash EPROM. The circuit includes a detector circuit (DC) using a pre-charge capacitor (C1), capacitor dividers [(C1/(C1+C2) and C3/(C2+C3)] and a voltage comparator (COMP) to signal a control logic circuit (CLC) when the programming voltage is within supply voltage ($V_{cc}$) of its final value. At that point the control logic circuit (CLC) boosts the voltage on one terminal of a boost capacitor (BC) by the value of the supply voltage ($V_{cc}$). The other terminal (XDD) of the boost capacitor (BC) furnishes the boosted programming voltage for the Flash EPROM.

16 Claims, 2 Drawing Sheets

SMART BOOST CIRCUIT FOR LOW VOLTAGE FLASH EPROM

BACKGROUND OF THE INVENTION

This invention relates to Flash Electrically-Programmable Erasable Read-Only-Memories (Flash EPROMs). In particular, this invention relates to a circuit for programming the floating gates of integrated-circuit memories such as Flash EPROMs.

Flash EPROM memories are generally described in U.S. patent application Ser. No. 08/315,526 filed Sep. 30, 1994, entitled "FLASH EPROM CONTROL WITH EMBEDDED PULSE TIMER AND WITH BUILT-IN SIGNATURE ANALYSIS", also assigned to Texas Instruments Incorporated. That Application is hereby incorporated herein.

In Flash EPROMs designed to operate using either 3 V or 5 V voltage supply, the wordline read voltage is boosted during the 3 V mode of operation. The circuit for boosting the wordline read voltage normally requires a large boost capacitor connected to the wordline supply voltage terminal connected to the wordline-select circuitry. For example, if the chip supply voltage $V_{CC}$ is 3 V, the boosting circuit may double the 3 V to create a wordline supply voltage of perhaps 5 V during read operation. However, during the programming mode of operation, the same wordline supply voltage terminal must be boosted (pumped) from a low voltage (perhaps 5 V) to high voltage (typically 12 V). Due to the large (perhaps 400 picofarads) boost capacitor BC, required by the low-voltage read operation, the rate of the programming voltage ramp slows the programming time significantly. During the nonlinear ramp of the programming voltage, most of the time is spent in reaching the last twenty to thirty percent of the final twelve volts.

In Flash EPROMs and other devices having a high boost capacitance connected to terminals, there is need for a circuit that decreases the voltage ramp time at the wordline voltage supply terminal and, therefore, improves the speed of operation.

SUMMARY OF THE INVENTION

The circuit of this invention overcomes these problems by improving significantly the programming speed of Flash EPROMs. The circuit includes a detector circuit using a pre-charge capacitor, capacitor dividers and a voltage comparator to signal a control logic circuit when the programming voltage is within supply voltage $V_{CC}$ of its final value. At that point the control logic circuit boosts the voltage on one terminal of a boost capacitor by the value of the supply voltage $V_{CC}$. The other terminal of the boost capacitor furnishes the boosted programming voltage for the Flash EPROM.

DETAILED DESCRIPTION OF THE INVENTION

Figure 1:
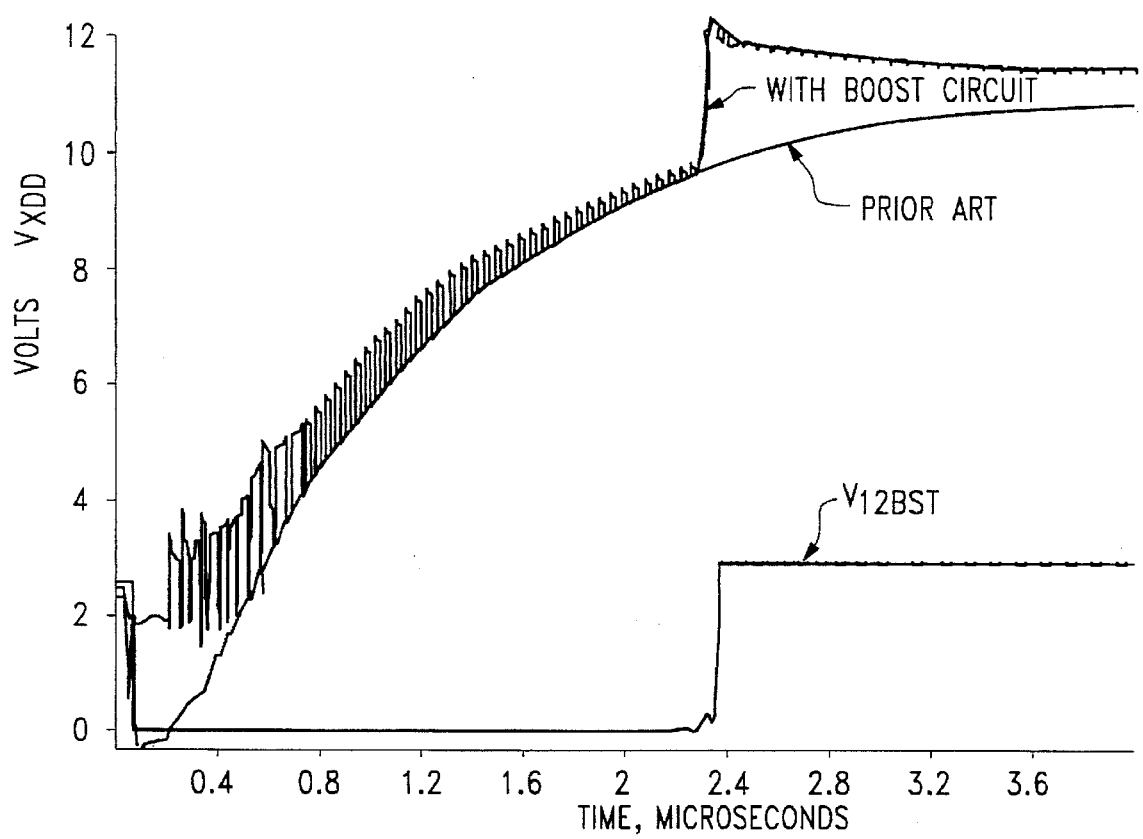
FIG. 1 illustrates the prior-art ramp of wordline supply voltage vs. time and illustrates the decrease in time resulting from use of the boost circuit of this invention.

In a 3 V/5 V Flash EPROM, the read speed is improved in the 3 V mode of operation by boosting the wordline read voltage. The boost is normally done using a relatively large boost capacitor BC tied to the wordline voltage terminal (XDD). Using the large boost capacitor BC, the read-operation wordline voltage is boosted to perhaps twice the value of $V_{CC}$ when using a $V_{CC}$ of 3 V. However, during the programming mode of operation, the wordline voltage terminal XDD needs to be pumped from a low voltage $V_{PP}$ (say 5 V) to higher voltage (typically 12 V). Due to the relatively large boost capacitor BC required by optional read operation at 3 V, the slow ramp rate at the wordline supply voltage terminal XDD causes the programming time to suffer significantly. The curve designated "PRIOR ART" in FIG. 1 illustrates the fact that most of the ramp time is spent reaching the last twenty to thirty percent of the twelve volts required for programming.

Figure 2:
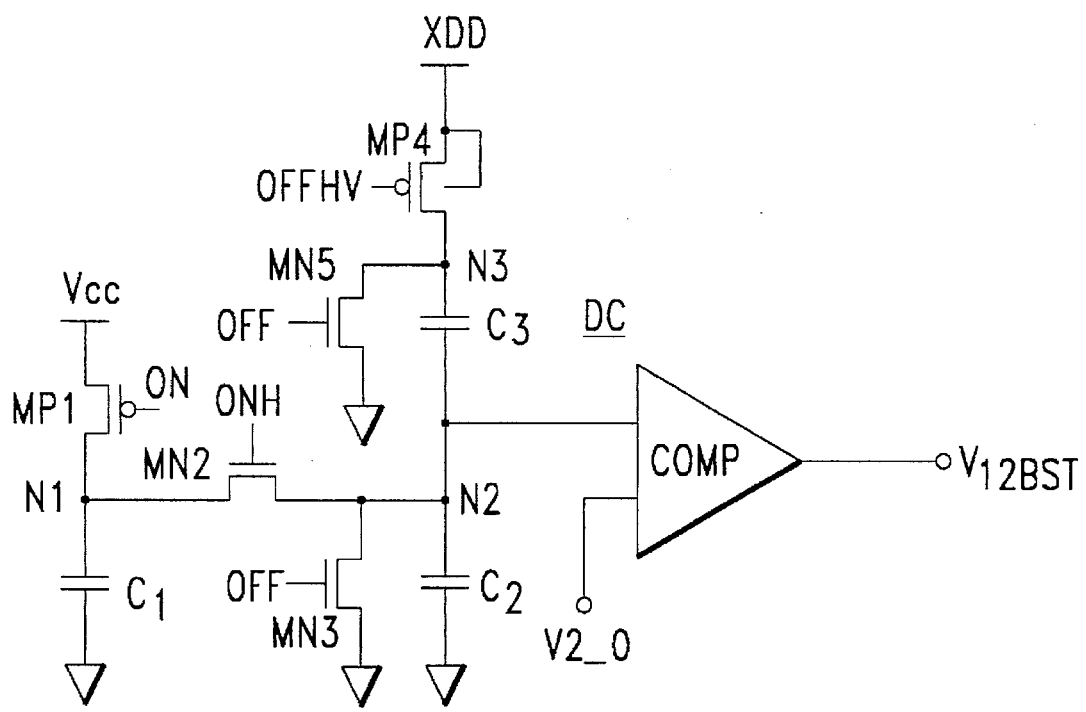
FIG. 2 illustrates the first stage of the circuit of this invention.
Figure 3:
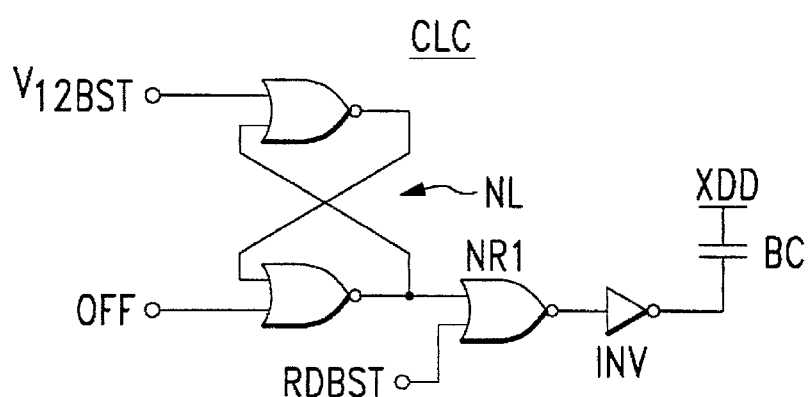
FIG. 3 illustrates the second stage of the circuit of this invention.

The circuits of FIGS. 2 and 3 cut the ramp time at the wordline supply voltage terminal XDD by at least one-half, thereby improving the programming speed significantly. The circuit is divided into two stages. The first stage, shown in FIG. 2, is a detector circuit DC includes a pre-charge capacitors C1 and C2, capacitor dividers C1/(C1+C2) and C3/(C2+C3), and a voltage comparator COMP. The second stage, shown in FIG. 3, includes the control logic circuit CLC that starts the boosts the voltage at wordline voltage terminal XDD.

In regard to operation of the circuit of FIG. 2, when the Flash EPROM is not in the programming mode, the detector circuit DC is in the pre-charge stage. In the pre-charge stage, capacitor C1 is pre-charged to $V_{CC}$ through transistor MP1 and transistor MN2 is OFF. In addition, nodes N2 and N3 are kept at ground by transistors MN3 and MN5 and transistor MN4 is OFF. However, when the detector circuit DC turns ON, transistors MP1, MN5 and MN3 are turned OFF first, then transistor MN2 is turned ON. This pre-charges capacitor C2 to $V_{CC}$ C1/(C1+C2). Then, transistor MP4 turns ON. The voltage at node N3 transitions from ground $V_{SS}$ to the voltage $V_{XDD}$ at terminal XDD. The voltage $V_{N2}$ at node N2 is then equal to $$V_{N2}=V_{XDD}C3/(C2+C3)+V_{CC}C1/(C1+C2)$$

where $V_{XDD}$ is the voltage at wordline voltage terminal XDD.

Assume the reference voltage V 2_0 at the comparator COMP is two volts. By properly selecting C1, C2 and C3, the comparator COMP is made to trip when the wordline voltage $V_{XDD}$ at wordline voltage terminal XDD reaches (12 V–$V_{CC}$). The wordline trip voltage $V_{XDDT}$ of the comparator is:

$$V_{XDDT}=[2CT-C1(C2+C3)V_{CC}]/C3(C1+C2)$$

where:

$$CT=(C1+C2)(C2+C3)$$

FIG. 3 illustrates the second stage of the circuit of this invention, which includes the control logic circuit CLC that boost the voltage at the XDD terminal. The control logic circuit CLC consists of a NOR latch NL and a NOR gate NR1. When the Flash EPROM is not in the programming mode of operation or when the detector circuit DC of FIG. 1 is not enabled, signal OFF is high. The NOR latch NR1 output is reset to low. Through the NOR gate NR1, the boost-driver circuit is controlled by the regular read-mode boost signal RDBST. When the Flash EPROM starts the programming mode of operation, or when the detector circuit DC of FIG. 1 is ON, signal OFF goes low and enables the NOR latch NR1. Once wordline supply voltage terminal XDD gets pumped to (12 V–$V_{CC}$), the signal from the detector circuit DC of FIG. 1 at terminal V12BST sets the NOR latch NL and starts the boost of the voltage at terminal XDD. This NOR latch NL guarantees that wordline voltage terminal XDD is boosted only one time and that wordline voltage terminal XDD is boosted down when the programming mode of operation is ended.

The curve marked "WITH BOOST CIRCUIT" in FIG. 1 illustrates the improvement in time required to reach the final value of wordline programming voltage upon trigger by the signal at the $V_{12BST}$ terminal.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A circuit for boosting the voltage at a wordline voltage terminal of a nonvolatile memory, said nonvolatile memory having a supply voltage terminal for connection to an external supply voltage, said circuit comprising:

a boost capacitor having a first terminal coupled to said wordline voltage terminal and having a second terminal;

a detector circuit having an input connected to said wordline voltage terminal and having a detector output, said detector output providing a signal at an approximate point in time when said wordline voltage reaches the difference between a final value and the value of said supply voltage; and a logic circuit having an input coupled to said detector output and having a logic output connected to said second terminal of said boost capacitor, said logic circuit boosting the voltage at said second terminal of said boost capacitor by about said value of said supply voltage upon receiving said signal from said detector circuit.

2. The circuit of claim 1, wherein said wordline voltage has a said final value of about 12 volts and wherein said supply voltage is 3 volts.

3. The circuit of claim 1, further including a charge pump causes said wordline voltage to reach said final value.

4. The circuit of claim 1, further including a charge pump providing said connection of said supply voltage at said supply voltage terminal.

5. The circuit of claim 1, wherein said detector circuit further includes a capacitor that is pre-charged to the value of said supply voltage.

6. The circuit of claim 1, wherein said detector circuit further includes a capacitor divider for dividing the voltage at said first terminal of said boost capacitor.

7. The circuit of claim 1, wherein said detector circuit includes a comparator for comparing a fraction of said voltage at said first terminal of said boost capacitor plus a fraction of said supply voltage to a fixed voltage.

8. The circuit of claim 1, wherein logic circuit includes a NOR latch receiving said signal from said detector circuit, a NOR gate receiving the output of said NOR latch, an inverter receiving the output of said NOR latch, the output of said inverter coupled to said second terminal of said boost capacitor.

9. A method for boosting a voltage at a wordline voltage terminal of a nonvolatile memory, said nonvolatile memory having a supply voltage terminal for connection to an external voltage supply and having a boost capacitor having a fast terminal coupled to said wordline voltage terminal and having a second terminal, said method comprising:

detecting the voltage at said wordline voltage terminal and providing a signal at an approximate point in time when said voltage at said wordline voltage terminal reaches the difference between a final value and the value of said external voltage supply; and boosting the voltage at said second terminal of said boost capacitor by about said value of said external voltage supply upon receiving said signal from said detector circuit.

10. The method of claim 9, wherein said final value of said wordline voltage is about 12 volts and wherein said supply voltage is 3 volts.

11. The method of claim 9, further including a charge pump for providing said final value of said wordline voltage.

12. The method of claim 9, further including a charge pump for providing said supply voltage.

13. The method of claim 9, wherein said detecting step includes a circuit having a capacitor that is pre-charged to the value of said supply voltage.

14. The method of claim 9, wherein said detecting step includes a circuit having a capacitor divider for dividing the voltage at said first terminal of said boost capacitor.

15. The method of claim 9, wherein said detecting step includes a circuit having a comparator for comparing a fraction of said voltage at said first terminal of said boost capacitor plus a fraction of said supply voltage to a fixed voltage.

16. The method of claim 9, wherein said boosting step includes a logic circuit having a NOR latch receiving said signal from said detector circuit, a NOR gate receiving an output of said NOR latch, an inverter receiving an output of said NOR latch, an output of said inverter coupled to said second terminal of said boost capacitor.

* * * * *